United States Patent [19]

Beutler

[11] 4,103,190
[45] Jul. 25, 1978

[54] COMPLEMENTARY POWER SAVING COMPARATOR/INVERTER CIRCUITS

[75] Inventor: Robert Russel Beutler, Austin, Tex.

[73] Assignee: Motorola, Inc., Schaumburg, Ill.

[21] Appl. No.: 781,076

[22] Filed: Mar. 25, 1977

[51] Int. Cl.² .................. H03K 17/30; H03K 17/60; H03F 3/45; H03K 17/04
[52] U.S. Cl. .................................. 307/362; 307/251; 307/358; 330/253; 330/264
[58] Field of Search ............... 307/355, 356, 358, 360, 307/362–364, 279, 251; 330/253, 264, 269

[56] References Cited

U.S. PATENT DOCUMENTS

| 3,943,380 | 3/1976  | Morgan et al. | 307/362 |
| 3,947,778 | 3/1976  | Hsiao et al.  | 330/253 |
| 3,956,708 | 5/1976  | Musa          | 307/355 X |
| 3,961,279 | 6/1976  | Davis         | 330/253 |
| 3,984,780 | 10/1976 | Hsiao et al.  | 330/253 |
| 4,004,158 | 1/1977  | Morgan        | 307/362 |

Primary Examiner—Larry N. Anagnos
Attorney, Agent, or Firm—Joe E. Barbee

[57] ABSTRACT

A CMOS power saving comparator/inverter circuit includes a complementary differential amplifier, one input of which is coupled to a voltage input. Another input of the complementary differential amplifier is coupled to a voltage reference circuit which includes two relatively high value resistors coupled in series between a P-channel MOSFET coupled to the positive voltage conductor and N-channel MOSFET coupled to the ground voltage conductor. An output of the differential amplifier is connected to an input of a CMOS inverter having its output connected to an output of the comparator/inverter circuit. The transition point, defined as the value of input voltage at which the output voltage is equal to one-half of the supply voltage, is virtually independent of the P-channel and N-channel threshold voltages. The transition point is much sharper than the transition point for a conventional CMOS inverter, and much less dependent upon various manufacturing parameter variations. The DC current of the circuit drops to zero when the input is at $V_{DD}$ or at ground.

6 Claims, 3 Drawing Figures

COMPLEMENTARY POWER SAVING COMPARATOR/INVERTER CIRCUITS

BACKGROUND OF THE INVENTION

Conventional CMOS inverters include a P-channel MOSFET and an N-channel MOSFET coupled between a positive and a negative power supply. The gate electrodes of the P-channel and N-channel MOSFET are coupled together to form the input, and the drains are connected together to form the output. The transition point, which may be defined as the input voltage required to cause the output to equal one-half of the power supply voltage, is determined by a number of parameters, including the relative channel length to channel width ratios of the P-channel MOSFET and the N-channel MOSFET. The transition point is determined partly by the magnitudes of the threshold voltages of the N-channel MOSFET and the P-channel MOSFET. The mobility in the channel regions of the N-channel MOSFET and the P-channel MOSFET are also parameters which affect the transition point. For conventional manufacturing processes, the variation in the transition point of a CMOS inverter having a 10 volt power supply can vary on the other of $\pm 1$ volt from a nominal value of the transition point. In certain applications, especially comparator applications, a much sharper transition point, much less dependent on variation of manufacturing parameters, is desirable.

SUMMARY OF THE INVENTION

It is an object of the invention to provide a complementary comparator circuit having a transition point which is substantially independent of processing parameter variations.

Briefly described, the invention is a circuit having a precise transition point. The circuit includes a reference circuit coupled between first and second voltage conductors for producing a reference voltage. The circuit also includes an amplifier coupled to the reference circuit for producing an amplified signal in response to an input signal applied to the amplifier. The transition point of the circuit is mainly determined by the reference voltage. A second amplifier is connected to the output of the first amplifier for producing an amplified, inverted output signal. The transition point of the circuit is primarily determined by the reference circuit. Complementary field effect transistors are utilized, in a preferred embodiment to implement the reference circuit, the first amplifier, and the second amplifier. In another preferred embodiment, the reference circuit and the first amplifier are coupled by means of field effect transistors responsive to the input signal to the power supply voltage, rendering the entire circuit power consumption to substantially zero when the input signal is at a particular voltage level.

DESCRIPTION OF THE INVENTION

Figure 1:
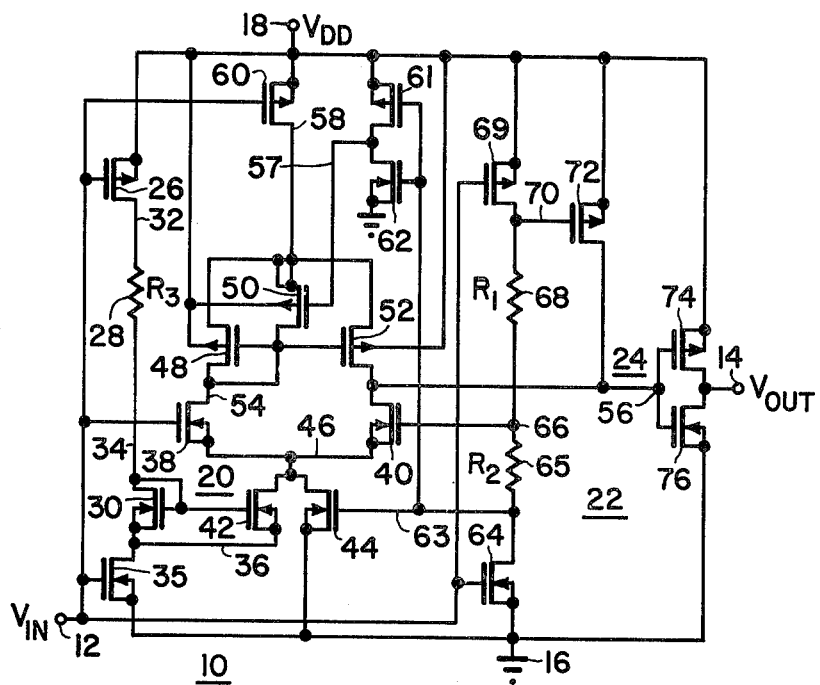
FIG. 1 is a schematic diagram of a presently preferred embodiment of the invention.

The circuit of FIG. 1 is a single input power saving comparator/inverter circuit. Circuit 10 includes an input 12, referred to as $V_{IN}$, an output 14 referred to as $V_{OUT}$, and is connected between $V_{DD}$ conductor 18 and ground conductor 16. Circuit 10 consists of differential amplifier 20, reference circuit 22, and inverter 24. Inverter 24 is a conventional CMOS converter including P-channel MOSFET 74 and N-channel MOSFET 76 connected in series between $V_{DD}$ and ground. The drains of MOSFETs 74 and 76 are connected to $V_{OUT}$, and the gate electrodes are connected together to node 56. Reference circuit 22 includes MOSFETs 69, 72, and 64 and resistors 65 and 68. Resistors 68 and 65, designated R1 and R2, respectively, may be precision discrete resistors, diffused resistors or thin film resistors, such as polycrystalline silicon resistors. Reference circuit 22 produces a reference voltage $V_{REF}$ at node 66. P-channel MOSFET 69 is connected between $V_{DD}$ and node 70 and has its gate connected to $V_{IN}$. Resistor 68 is connected between node 66 and node 70. Resistor 65 is connected between node 66 and node 63. N-channel MOSFET 64 has its gate connected to $V_{IN}$, its drain connected to node 63 and its source connected to ground. Differential amplifier 20 includes current source circuitry including MOSFETs 26, 30, 35, 42 and 44 and resistor 28. P-channel MOSFET 26 is connected between $V_{DD}$ and node 32 and has its gate connected to $V_{IN}$. Resistor 28 is connected between node 32 and node 34. MOSFET 30 has its gate and drain connected to node 34 and its source connected to node 36. N-channel MOSFET 35 has its gate connected to $V_{IN}$, its source connected to ground, and its drain connected to node 36. N-channel MOSFET 42 has its gate connected to node 34, its source connected to node 36, its drain connected to node 46. N-channel MOSFET 44 has its gate connected to node 63, its source connected to ground, and its drain connected to node 46. The amplifier portion of differential amplifier 20 includes N-channel MOSFETs 38 and 40 and P-channel MOSFETs 48 and 52, and power control MOSFETs 50, 60, 61, and 62. MOSFET 38 has its gate connected to $V_{IN}$, its source connected to node 46, and its drain connected to node 54. MOSFET 40 has its gate connected to node 66, its source connected to node 46 and its drain connected to node 56. MOSFET 48 has its source connected to node 58, its gate connected to node 54, and its drain connected to node 54. MOSFET 52 has its drain connected to node 56, its gate connected to node 54, and its source connected to node 58. P-channel MOSFET 50 has its gate connected to node 57, its source connected to node 58 and its drain connected to node 54. P-channel MOSFET 60 has its source connected to node $V_{DD}$, its gate connected to $V_{IN}$, and its drain connected to node 58. P-channel MOSFET 61 and N-channel MOSFET 62 form a CMOS inverter having its output connected to node 57 and its input connected to node 63.

Figure 2:
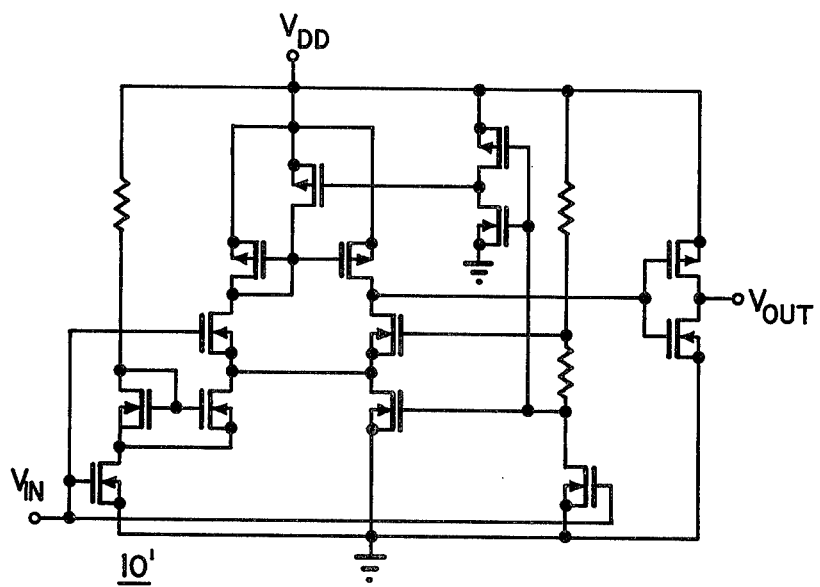
FIG. 2 is a schematic diagram of another embodiment of the invention.

FIG. 2 depicts a single input comparator/inverter circuit identical to the circuit of FIG. 1 except that MOSFETs 26, 60, and 69 have been omitted and resistors 28 and 68 and node 58 have all been connected directly to $V_{DD}$. The circuit of FIG. 2 consumes zero power only when $V_{IN}$ is at ground, but not when $V_{IN}$ is at $V_{DD}$ volts. This embodiment is suitable for many applications wherein a "power-down" mode is needed, and is less complex and less expensive than the embodiment of FIG. 1.

Figure 3:
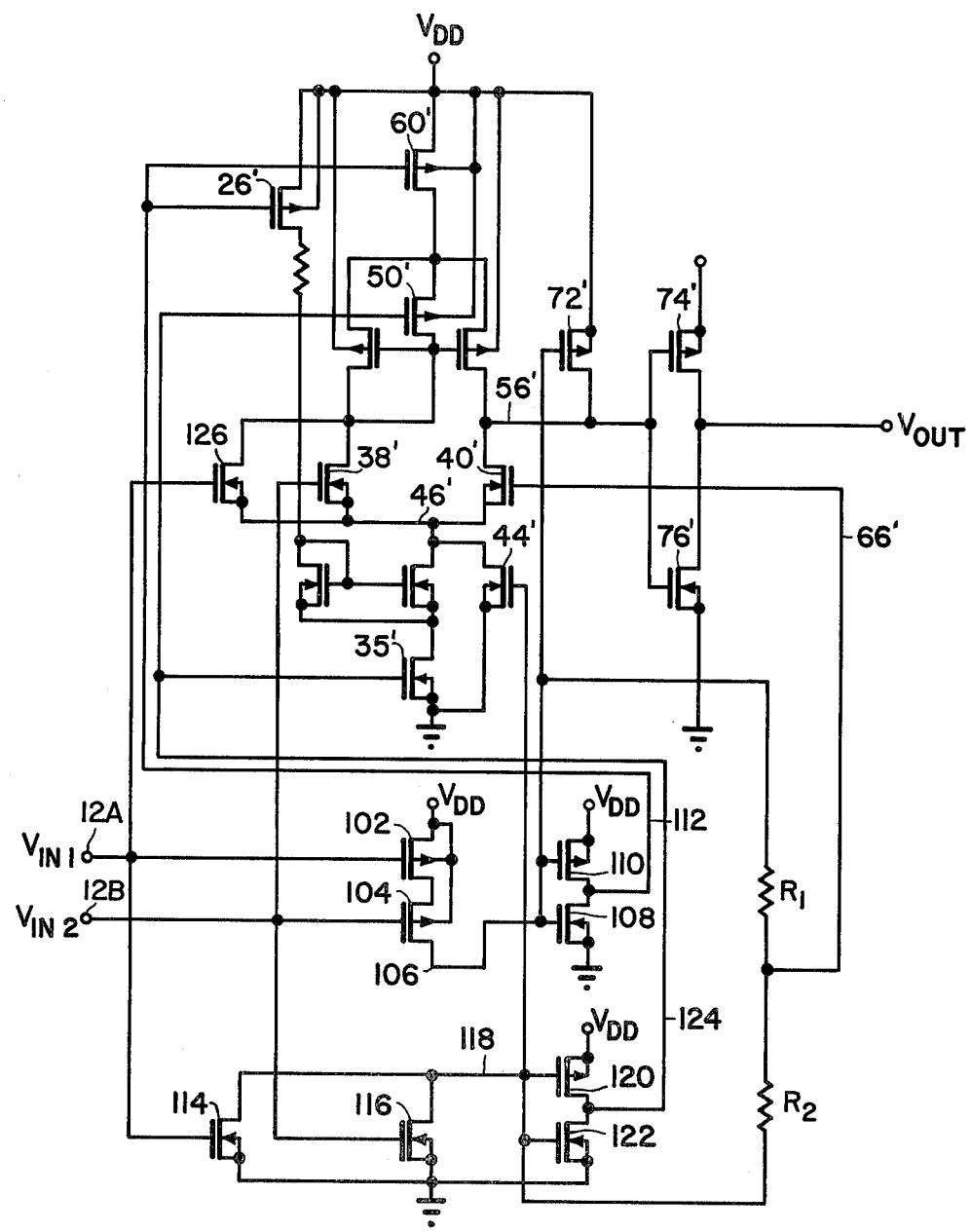
FIG. 3 is a schematic diagram of yet another embodiment of the invention.

FIG. 3 is a schematic diagram of a two input comparator/ inverter circuit. The reference circuit, the differential amplifier, and the output inverter are substantially similar to those in FIG. 1. However, the input circuitry has been added in FIG. 3 to accomplish the desired response to two inputs. FIG. 3 includes inputs 12A, labelled $V_{IN1}$ and 12B, labelled $V_{IN2}$. P-channel MOSFETs 102 and 104 are coupled in series between $V_{DD}$ and node 106. The gate of MOSFET 102 is connected to input 12A and the gate of MOSFET 104 is connected to input 12B. N-channel MOSFETs 114 and 116 are connected in parallel between ground and nodes 118. The gate of MOSFET 114 is connected to $V_{IN1}$ and the gate of MOSFET 116 is connected to $V_{IN2}$. P-channel MOSFET 110 and N-channel MOSFET 108 are connected to form an inverter between $V_{DD}$ and ground. The gates of MOSFETs 110 and 108 are connected to node 106. It should be noted that the corresponding MOSFETs in FIG. 1 have primed reference numerals in FIG. 3. Node 106 is also connected to the gate of P-channel MOSFET 72'. The drains of MOSFETs 108 and 110 are connected to 112, which is connected to the inputs of MOSFETs 26' and 60'.

P-channel MOSFET 120 and N-channel 122 form another inverter connected between $V_{DD}$ and ground. The gates of MOSFETs 120 and 122 are connected to node 118 and the drains are connected to node 124. Node 124 is connected to the gate of MOSFET 35' and the gate MOSFET 50'. Resistor R1 of the reference circuit is connected between node 66' and 106. Resistor R2 is connected between node 60' and node 118.

It is seen that FIG. 1 is essentially equivalent to a CMOS inverter with a very accurate transition point. It is also equivalent to a CMOS inverter in that the DC current of the inverter drops to zero when the input is at $V_{DD}$ or ground. With this circuit, the transition point is nearly independent of processing variations. This is not true of a standard CMOS inverter. The transition point is defined as the value of $V_{IN}$ required to cause the output signal to equal one-half of $V_{DD}$. For conventional CMOS manufacturing processes, the transition point of a CMOS inverter of a particular design may vary by ±1 volt from a nominal value, for $V_{DD}$ equal to 10 volts. The circuit of FIG. 1 overcomes this disadvantage in that its transition point is only approximately ±50 millivolts, for $V_{DD}$ equal to 10 volts, over the usual manufacturing processing range. The circuit of FIG. 1 is nearly independent of process variations and relative impedances of the various P-channel and N-channel devices. It is important that the pair of N-channel MOSFETs consisting of N-channel MOSFETs 38 and 40 and the pair of P-channel MOSFETs 48 and 52 have as low offset voltage (i.e., difference in threshold voltage) as possible. In an integrated circuit implementation, the offset voltage variation can be minimized by topographical layout techniques.

The circuit of FIG. 1 is essentially comprised of a current mirror type current source, a differential amplifier, an output buffer and assorted switch devices to make the circuit consume zero power for the logical "0" and logical "1" input states.

The operation of the circuit of FIG. 1 is as follows.

Assume initially that $V_{IN}$ is at zero volts. Then MOSFET 35 is off and no current will flow in node 34 of the current source. MOSFET 38 of the differential amplifier portion is also off so that no current will flow through that leg of the differential amplifier 20. Because of the action of load devices 48 and 52, MOSFET 52 will be in a very high impedance state. To guarantee that MOSFET 52 is off, MOSFET 50 pulls node 54 to $V_{DD}$. Since MOSFET 64 is off, node 63 and node 66 go to $V_{DD}$. MOSFET 40 and MOSFET 44 will be turned on which will guarantee that node 56 remains at ground, which will in turn cause $V_{OUT}$ to remain at $V_{DD}$ volts.

As $V_{IN}$ starts rising and passes the N-channel threshold voltage, MOSFETS 35 and 64 will turn on. Then current will flow in the current source. It is assumed that the current flowing in the current source is determined essentially by resistor R3. Also, node 63 will be pulled to ground. It is also assumed that the series resistance of R1 and R2 is much greater than the "on" resistance of MOSFETs 64 and 69. Node 66 will then be at $V_{REF} = [R2/(R1+R2)] V_{DD}$. Since MOSFETs 50 and 44 are now turned off, the differential amplifier is in its active region. When $V_{IN}$ approaches $V_{REF}$ in value, the differential amplifier will be in its high gain region of operation and node 56 will approach $V_{DD}$ at a steep rate. During this transition, node 56 will pass through the transition point of the output buffer made up of MOSFETs 74 and 76. $V_{OUT}$ will go from $V_{DD}$ to ground volts.

When the magnitude of $V_{IN}$-$V_{DD}$ becomes less than the P-channel threshold voltage, MOSFETs 26 and 60 will turn off, causing the current through the current source and differential amplifier to be cut off. MOSFET 69 will turn off, which will pull nodes 66 and 70 to ground volts. This will in turn cause MOSFET 72 to conduct, which will guarantee that node 56 remains at $V_{DD}$ volts. Therefore, circuit 10 acts as a very precise transition point comparator/inverter which has substantially zero power consumption when the input $V_{IN}$ is at either ground volts or $V_{DD}$ volts.

FIG. 2 is the same type of circuit as FIG. 1, but has zero power consumption only when $V_{IN}$ is at ground volts. This circuit could be useful, for example, on an LSI type circuit wherein a one-shot circuit or a one-pin oscillator is desired which has a standby zero power mode.

The circuit in FIG. 3 is essentially equivalent to the circuit in FIG. 1 except for an added input. The output of the circuit will go low if either or both inputs have a $V_{IN}$ greater than $V_{REF}$. This circuit would have application when working in conjunction with the single input comparator circuit of FIG. 1.

Referring to FIG. 3, first assume that $V_{IN1}$ and $V_{IN2}$ are both at ground volts. Since MOSFETs 114 and 116 are off, nodes 118 and 106 are at $V_{DD}$. Therefore, node 66' is at $V_{DD}$ volts and no current will flow through reference resistors R1 and R2. Nodes 124 and 112 are at ground, therefore MOSFET 35' is off, preventing any current from flowing through the current source of the differential amplifier. MOSFETs 40' and 44' are on, and therefore node 56' is at ground, which results in the output being at $V_{DD}$.

When either $V_{IN1}$ or $V_{IN2}$ starts rising and passes the N-channel threshold voltage, node 118 will go to ground. It is assumed that the sum of the resistance of the reference resistors R1 and R2 is much greater than the "on" resistance of MOSFETs 114, 116, 104, and 102. Node 66' will change from $V_{DD}$ volts to $V_{REF}$, which is given by the above equation. Node 124 will go to $V_{DD}$ volts which will cause MOSFET 35' to turn on, and the differential amplifier section will become active. As $V_{IN1}$ or $V_{IN2}$ approaches $V_{REF}$, the differential amplifier will be in its high gain region of operation, and node 56' will approach $V_{DD}$ at a steep rate corresponding to the gain of the differential amplifier section. Node 56' will pass through the transition point of the output buffer consisting of MOSFETs 74' and 76', and $V_{OUT}$ will go from $V_{DD}$ to ground volts. When the magnitude of $V_{IN}-V_{DD}$ becomes less than the P-channel threshold voltage, nodes 118 and 106 will go to ground. Reference node 66' will also go to ground. Node 112 will go to $V_{DD}$, which will cause MOSFETs 26' and 60' to turn off, thereby preventing any current from flowing through the current source of the differential amplifier. MOSFET 72' is turned on and guarantees that node 56' will remain high, which will cause $V_{OUT}$ to remain low. For all combinations of the inputs being at $V_{DD}$ or ground the circuit consumes virtually zero power.

What is claimed is:

1. A circuit having a precise transition point comprising: input means for receiving an input signal; first and second voltage conductors; reference means coupled between said first and second voltage conductors for producing a reference voltage; first amplifier means coupled to said reference means for producing an amplified signal in response to said input signal, said amplified signal having a first transition point determined by said reference voltage; second amplifier means coupled to said first amplifier means for producing an amplified inverted output signal having a second transition point determined by said first transition point in response to said amplified signal; and first power control means for selectively electrically coupling said reference means to said first or second power conductors in response to said input signal.

2. The circuit as recited in claim 1 further comprising second power control means for selectively electrically coupling said first amplifier means to said first or second power conductors in response to said input signal.

3. A complementary MOS comparator circuit comprising:

first and second voltage means;
   input means for conducting an input signal;
   reference means coupled to said first and second voltage means and coupled to said input means for generating a reference voltage when said input signal is greater in magnitude than a first threshold voltage;
   differential amplifier means coupled to said input means and said reference means for producing a first output signal substantially equal to the voltage of said first voltage means on the condition that said input signal is lower than said reference voltage and substantially equal to the voltage of said second voltage means on the condition that said input signal is greater than said reference voltage.

4. The complementary MOS comparator circuit as recited in claim 3 further comprising:

first means coupled to said first and second voltage means and to said reference means and to said differential amplifier means and being responsive to said input signal for both electrically coupling said reference means and said differential amplifier means to said first voltage means and electrically de-coupling said reference means and said differential amplifier means from said second voltage means when said input signal is at a voltage substantially equal to the voltage of said second voltage means.

5. The complementary MOS comparator circuit as recited in claim 4 further comprising second means coupled to said first and second voltage means and to said reference means and to said differential amplifier means responsive to said input signal for both electrically coupling said reference means and said differential amplifier means to said second voltage means and electrically de-coupling said reference means and said differential amplifier means from said first voltage means where said input signal is at a voltage substantially equal to the voltage of said first voltage means.

6. The complementary MOS comparator as recited in claim 4 further comprising a complementary MOS inverter coupled to said differential amplifier means for producing an inverted second output signal responsive to said first output signal.

* * * * *